April 22, 1958 J. P. ECKERT, JR 2,831,985

AMPLIFIER WITH-FEEDBACK

Filed July 28, 1955 4 Sheets-Sheet 1

INVENTOR.
JOHN PRESPER ECKERT, JR.
BY
Charles C. English
AGENT

April 22, 1958 J. P. ECKERT, JR 2,831,985

AMPLIFIER WITH-FEEDBACK

Filed July 28, 1955 4 Sheets-Sheet 2

INVENTOR.
JOHN PRESPER ECKERT, JR.
BY
Charles C. Englisch
AGENT

INVENTOR.
JOHN PRESPER ECKERT, JR.
BY
Charles C. English
AGENT

April 22, 1958 J. P. ECKERT, JR 2,831,985

AMPLIFIER WITH-FEEDBACK

Filed July 28, 1955 4 Sheets-Sheet 4

INVENTOR.
JOHN PRESPER ECKERT, JR.
BY
Charles C. English
AGENT

United States Patent Office 2,831,985
Patented Apr. 22, 1958

2,831,985

AMPLIFIER WITH FEEDBACK

John Presper Eckert, Jr., Philadelphia, Pa., assignor to Sperry Rand Corporation, New York, N. Y., a corporation of Delaware Application July 28, 1955, Serial No. 524,844

17 Claims. (Cl. 307—88.5)

This invention relates to a novel method of and means for amplifying electric signals. A system and process for amplification is taught which is particularly useful in the construction of computing and control equipment.

In the past, amplification of electric signals has been accomplished using amplifying elements such as vacuum tubes, transistors and saturable magnetic cores. These devices will, upon receiving an input signal, deliver to a load circuit a corresponding signal many times larger. The increase in signal is usually called the gain or amplification factor and is dependent not only on the element itself, but also on cooperating circuit components such as resistors, transformers and the like.

For a particular element and circuit arrangement, the amplification factor will be determined and essentially constant. The amplification factor is further determined by the band width of the signals to be amplified. When very narrow bandwidth signals are amplified, the circuit components can be designed to be especially effective in the selected frequency range and correspondingly greater amplification obtained. For example, resonant circuits similar to those found in radio receivers can be used to restrict the bandpass and increase the gain.

As the bandwidth is increased, the gain is correspondingly decreased to an upper cutoff limit of the amplifier where the amplification factor reduces to unity. The bandwidth in turn defines the rise time of the amplifier in response of a step input. That is, if the input terminal is instantaneously switched, for example, from some reference voltage to a higher voltage, say 1 volt higher, then an output signal step will be produced 1 x N in size where N is the amplification factor. The output step, however, will not be instantaneous, but will be accomplished in a finite time usually referred to as the rise time. If the amplifier is linear in amplitude response, then the slope of the rise will be independent of the size of the input signal and, within the operating limits of the amplifier, the amplification factor will be constant. It can be seen from the foregoing that amplifiers and associated circuits as presently used perform in a manner to give a constant power gain-bandwidth product. If the power gain is increased, there is a corresponding reduction in bandwidth of operation and the rise time for step or pulse signals becomes longer. Similarly if faster operation is desired, then the power gain decreases.

In the present invention, a method and apparatus is described whereby the operation of amplifiers is improved and the foregoing limits in amplifier performance circumvented.

It is accordingly a first object of this invention to provide a method of amplification giving greater power gain without a corresponding reduction in bandwidth.

It is a further object of this invention to provide an amplifier operable from relatively small input signals.

It is a further object of the invention to provide a pulse amplifier having novel means for reshaping and retiming signals.

It is a still further object of the invention to provide an amplifier of electric signals whose output is of the correct form to provide inputs to other like amplifiers.

Another object of the invention is to provide a novel amplifier utilizing an electron tube.

Another object of the invention is to provide a novel amplifier utilizing a transistor.

Other objects and advantages of the present invention will clearly appear to those skilled in the art from the following description of embodiments utilizing its teachings taken together with the figures in which.

Figure 1:
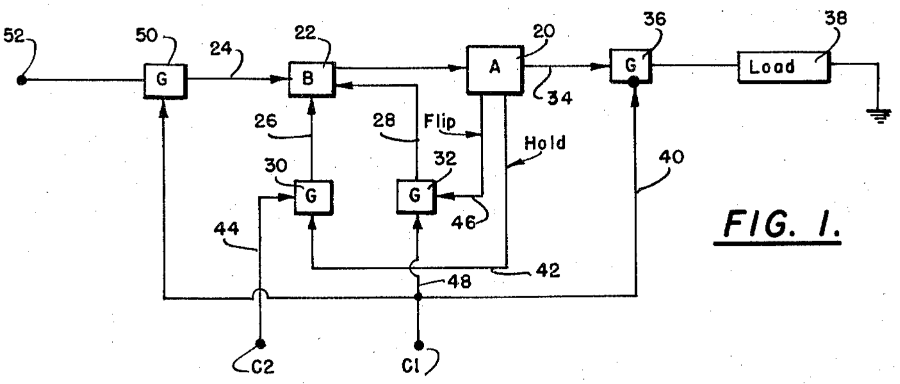
Figure 1 is a block diagram of the invention in general form.

The invention depends for its operation on means for the selective reflex amplification of signals through a single amplifying element. In Figure 1 is shown a block diagram from which the operation of the invention can be understood. The invention has an active amplifying element 20 which can be any electric device whose output signals are larger than causative input signals. Examples of such amplifiers are electron tubes, transistors and saturable magnetic elements, circuits for which will be described.

Returning to Figure 1, the amplifier 20 receives signals through a buffer input 22 which in turn receives signals from input lines 24, 26 and 28. The presence of a signal on any of these three input lines passes through the buffer 22 to the amplifier 20. The line 24 is connected to a gate 50 while the lines 26 and 28 are connected respectively to gates 30 and 32. A plurality of output lines are connected from the amplifier 20. The line 34 is connected from the amplifier 20 through the gate 36 to a load 38. Coincidence of signals at the gate 36 of the output on line 34 and a gating potential on a line 40 cause power to flow to the load 38. In the illustration shown the wire 40 is an inhibition input, hence gate 36 can have an output only when the potential on wire 40 is zero. A second output from the amplifier 20 is delivered to the gate 30 through a line 42 and signals on this line will conditionally pass the gate 30 when gating signals are coincidentally applied to the gate through a line 44. A further output of the amplifier 20 is delivered through a line 46 to the gate 32, which in turn will pass output signals when conditioned by gating signals on the line 48. Thus when the gate 36 is conditioned, power can flow from the amplifier 20 to the load 38. When the gate 32 is conditioned, power can flow from the amplifier 20 to the buffer 22 and to the input of the amplifier 20. Similarly, when the gate 30 is conditioned, power can also flow from the amplifier output back to the amplifier input.

Figure 2:
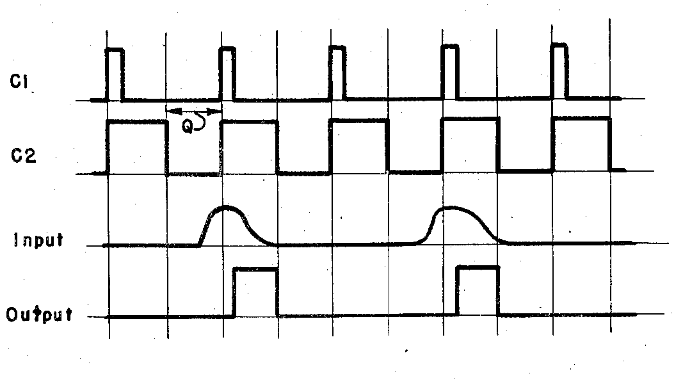
Figure 2 is a timing diagram of signals and control pulses.

The line 34 is adapted to deliver the full output power of the amplifier 20 to the load 38 when the gate 36 is open. The line 46 is adapted to deliver the full output power of the amplifier 20 to the input thereof when the gate 32 is open. The line 42 is adapted to deliver only a fraction of the output power of amplifier 20 to the input thereof when the gate 30 is open. Control signals for the gate 30 are provided at a terminal C2. Control signals for the gates 32, 36 and 50 are provided at a terminal C1. Typical timing signals useful for the operation of the apparatus of the invention are shown in Figure 2. The timing signal C2 can be a regularly occurring square wave and during the positive excursions of this signal, the gate 30 will pass signals. The timing signal C1 starts at the same time as signal C2, but is a pulse which lasts for a shorter time. It should preferably be only a small fraction of the period of signal C2. During the positive excursions of signal C1, gates 32 and 50 will pass signals and gate 36 is designed to block signals.

The operation of the invention can now be described referring to Figures 1 and 2. When an input signal is delivered to the input terminal 52 of the gate 50, the signal will be ineffective except during the positive excursions of timing signal C1. During those periods, the gate 50 will pass the signal through the buffer 22 to the amplifier 20. Here the signal is amplified and outputs appear on the lines 34, 42 and 46. The output on line 34 is without effect, since the presence of timing signal C1 inhibits the gate 36. The signal on line 46 is fully effective, however, since the gate 32 is opened by the timing signal C1. The output on line 42 is without effect even though the signal will pass gate 30 conditioned by timing signal C2 since the signal is overridden in buffer 22 by larger signals on line 28. All of the power of the amplifier 20 thus flows through line 46, gate 32 and buffer 22 back to its input. This feedback is arranged to be regenerative, so that the feedback signal, which by amplification is larger than the input signal, will override the input signal and inject a more powerful input. This in turn is further amplified and regenerated to cause the amplifier 20 to rapidly move to its active state, being limited at its upper end by the usual saturation effects.

The timing signal C1 is arranged to persist long enough so that the smallest size input signals will act by reflex amplification to carry the amplifier 20 to saturation. At the termination of signal C1, signal C2 becomes effective. This signal has been holding open gate 30 which passes a smaller output power back to the input, and this feedback power is designed to be just sufficient to maintain the amplifier 20 in active condition. When signal C1 disappears, gate 50 closes desensitizing the circuit to further inputs, gate 32 closes thus removing the powerful feedback which would otherwise consume useful output unnecessarily, and gate 36 opens, allowing power to flow to the load 38. This condition will persist until the termination of signal C2. At that time gate 30 closes thus cutting the recirculation path and the active state of the amplifier collapses. The circuit then will remain inactive until the arrival of the next timing signal C1 when an input can return the amplifier to an active state. The signal C1 can recur immediately after the cessation of signal C2 or a quiescent period Q can be provided. Some minimum quiescent period is usually required to permit the output signals to disappear before the circuit is resensitized. If any output signal remains at the time of the arrival of timing signal C1, then the circuit will return itself to active state in the absence of an input signal.

Figure 4:
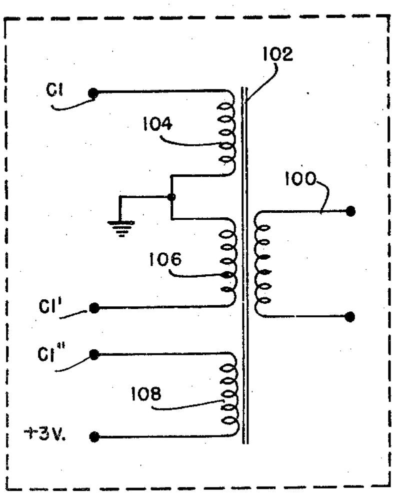
Figure 4 is a special circuit for supplying control pulses useful in the invention.
Figure 3:
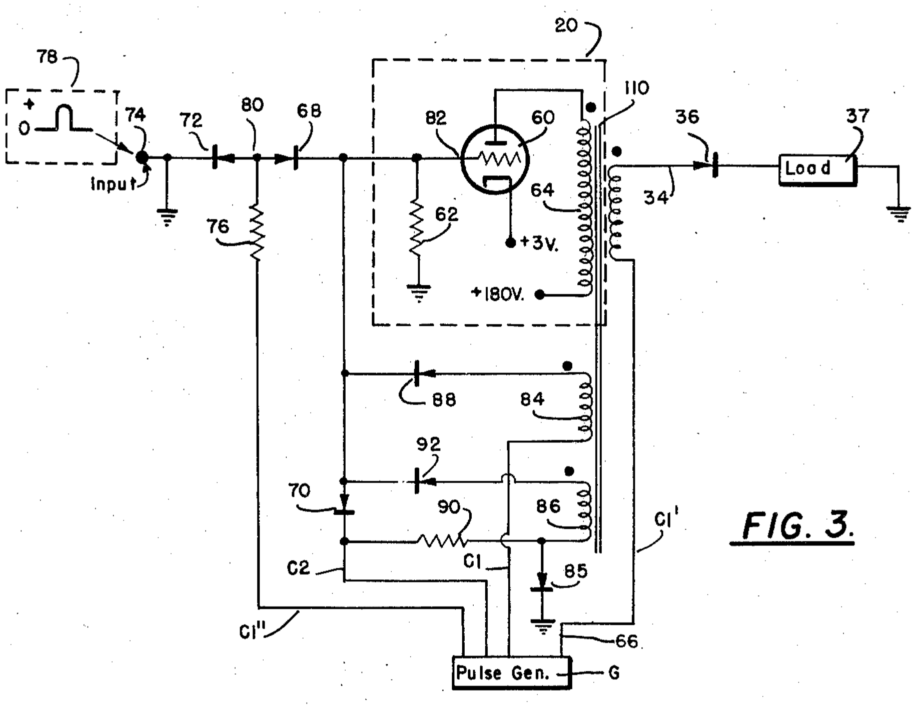
Figure 3 is an embodiment of the invention utilizing an electron tube.
Figure 3A:
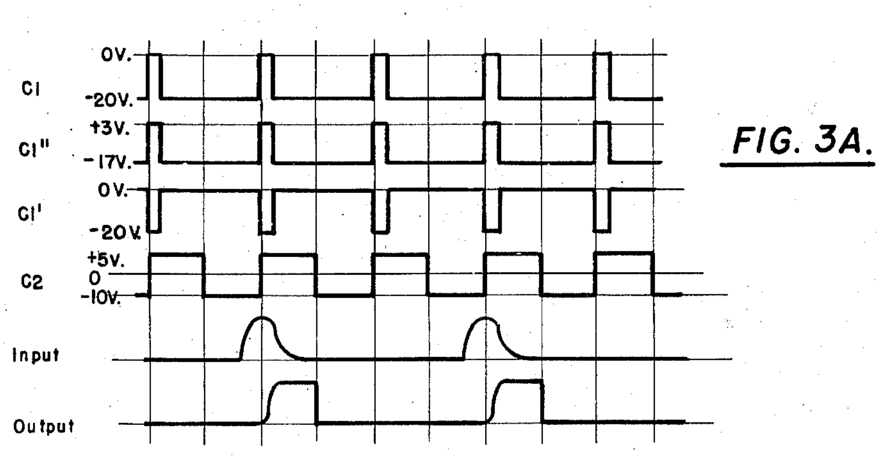
Figure 3A is a timing diagram of signals and control pulses for the circuit of Figure 3.

In Figure 3 is shown the application of the principles of this invention to a circuit using an electron tube amplifier. The area within the dotted lines 20 corresponds to the amplifier 20 and consists of a conventional triode tube 60 whose input grid has a bias resistor 62 returned to ground. The cathode is connected to a positive bias voltage and the plate is connected through an input winding 64 of a transformer 110 to a source of positive potential. The tube for the circuit shown may preferably be chosen to have a grid cutoff of −2½ volts. Thus inputs below ½ volt are ineffective and the bias of −3 volts holds the tube 60 off. The output line 34 corresponds to the like output of Figure 1. The diode gate 36 is connected and disconnected by the signal C1′ applied to a terminal 66. The signal C1′ is identical to signal C1 of Figure 2 except that for circuit convenience it is of opposite phase. The operation of input gate 50 is provided by a diode 68 operating in conjunction with a further diode 72. During the time that signal C1″ is down at −17 volts, the diodes 72 and 68 are disconnected and no signals can pass from the input terminal 74 to the amplifier 20. The signal C1″ is identical to signal C1 but is referred to +3 volts instead of 0 volt. The signals C1, C1′ and C1″ may be obtained from a single source as shown in Figure 4. Pulses are applied to an input winding 100 of a transformer 102. Secondary winding 104 gives signals C1 swinging between 0 volt and −20 volts. Secondary winding 106 of opposite phase gives signals swinging between −20 volts and 0 volt. Secondary winding 108 gives signals swinging between +3 volts and −17 volts. Figure 3A shows the relation of the various signals that are applied to Figure 3.

Returning to Figure 3, it can be seen that when signal C1″ goes positive to +3 volts, it will draw current either through diode 68 or diode 72. If the input terminal 74 is connected through a source 78 to ground, then current flow through the source will prevent the junction 80 from rising above 0 volt and a 3 volt drop will be developed across resistor 76. If the source 78 produces a positive signal, however, then the junction 80 will rise accordingly to some positive voltage and current will be drawn through diode 68 and resistor 62 to raise the potential on the input grid 82 of the tube 60. If the input signal exceeds ½ volt, then the grid 82 will be less than 2½ volts below the cathode and the tube will start to conduct.

Outputs appearing in winding 64 are induced also in windings 84 and 86. The presence of signal C1 at the lower terminal of winding 84 holds it at 0 volt and positive feedback potentials pass buffer diode 88 to the amplifier grid 82. These feedback signals, being amplified, are larger than the input signal at junction 80. Consequently the grid 82 will be more positive than junction 80 and diode 68 will disconnect. The powerful feedback from winding 84 will continue until the end of signal C1. When C1 goes to −20 volts, the diode 88 is opened and this feedback ceases. C1′ simultaneously moves to 0 volt to connect diode 36 to pass power to the load 37 and signal C1″ returns to −17 volts to open diodes 72 and 68.

The signal C2 continues at +5 volts thus permitting the grid 82 to remain positive. The winding 86, which has fewer turns than winding 84, has a small induced signal. The lower end of winding 86 is clamped to ground by diode 85 and resistor 90 which receives +5 volts from signal C2. The diode 92 passes these signals from winding 86 to the grid 82 to hold the tube 60 in active condition. At the termination of signal C2, it returns to −10 volts thus not only cutting the feedback from winding 86 by opening diode 92, but also by forceably lowering grid 82 through diode 70. The active condition of amplifier 20 ceases and the output to the load 37 stops.

Figure 5:
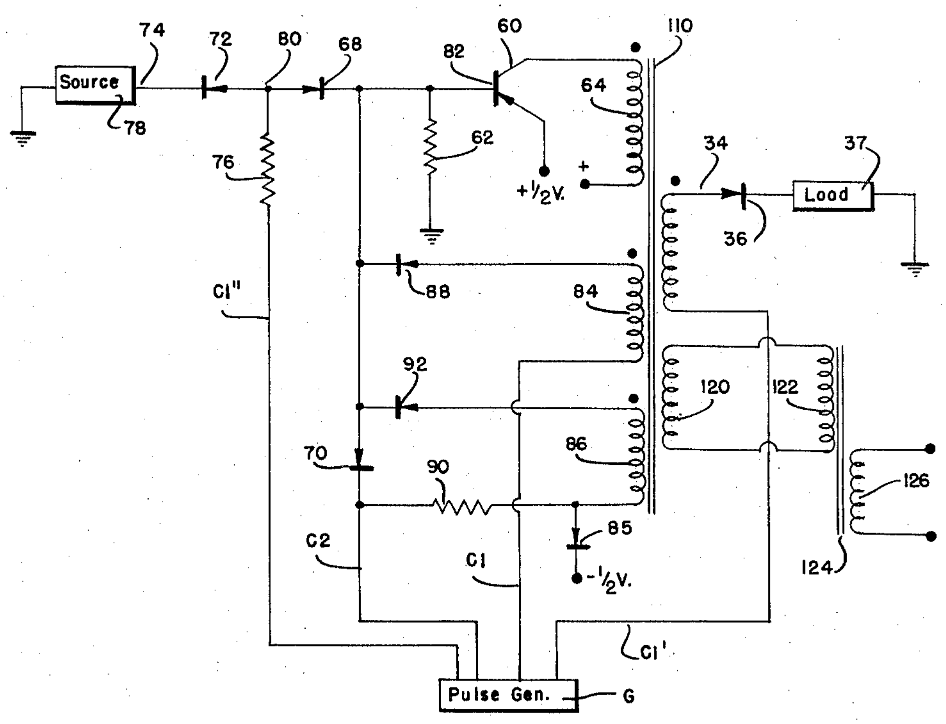
Figure 5 is an embodiment of the invention utilizing a transistor.

In Figure 5 is shown a similar circuit utilizing a transistor in place of an electron tube. Like numbers identify like items in Figures 3 and 5 except that the grid 82 becomes the transistor base of the transistor 60 in Figure 5. The voltages and signals can be smaller and for example are shown as 10% of the size used for the electron tube amplifier.

In Figures 3 and 5 a pulse generator G has been shown for supplying the necessary pulses.

Figure 5A:
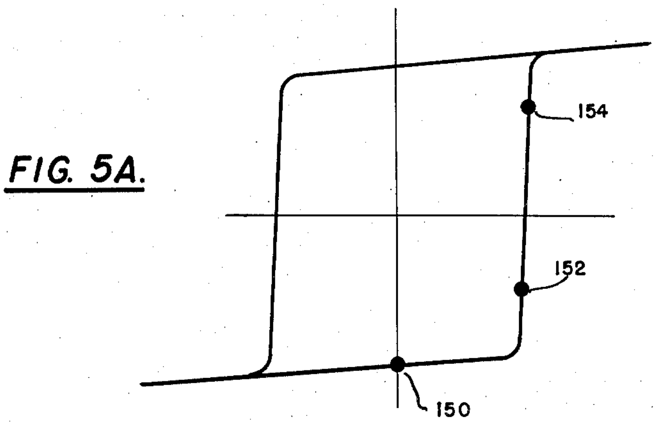
Figure 5A shows a hysteresis loop for the core 124 of Figure 5.

It was stated earlier in the discussion of Figures 1 and 2 that a quiescent period is desirable to allow the circuit to stabilize between the cessation of an active period and the application of a subsequent input pulse. This time can also be used to revert the core of the transformer 110. If only positive pulses are applied to the transformer 110, the core material will move progressively higher on its hysteresis loop until eventually saturation is reached. Thus after a pulse has passed through the core, the core will be at a higher point on its hysteresis loop than before. It can be conveniently returned to its correct operating point during the quiescent period. A method for such reversion is shown in Figure 5 which consists of a further output winding 120 connected to a winding 122 on a square loop core 124. During the time output current is delivered to the load 37, power is also delivered to winding 122 which operates on core 124 to move it up its hysteresis loop. A typical square hysteresis loop is shown in Figure 5A. At the start of an output signal, core 124 will be at a lower operating point 150 corresponding to negative remanence. The output signal, however, will move the core to some higher operating point 152. During the quiescent period, a very strong reverting pulse is applied to a winding 126 which returns the core to negative saturation and correspondingly induces a signal in winding 122 which operates through winding 120 to correspondingly revert core 110. The transformer core 110 can thus be accurately returned to its operating point even though it may not itself have a square loop characteristic.

It should be noted that the core 124 "remembers" the total flux change in transformer 110. The more pulses pass through the transformer 110 the farther core 124 will move up its hysteresis loop. Thus a plurality of pulses might take core 124 to a point 154 on its hysteresis loop and subsequent reversion of the core 124 would correspondingly induce a larger reverting flux in transformer 110. The reversion thus need not be performed every pulse time or cycle, but could be done after a plurality of pulses had passed through the amplifier.

In event the broad combination of Figure 1 is carried out in such a way that no transformer such as 110 is required, or if that transformer has a core with a linear B–H loop, the parts 120, 122, 124 and 126 are not required. Their addition is considered an improvement and is not part of my invention.

Figure 6:
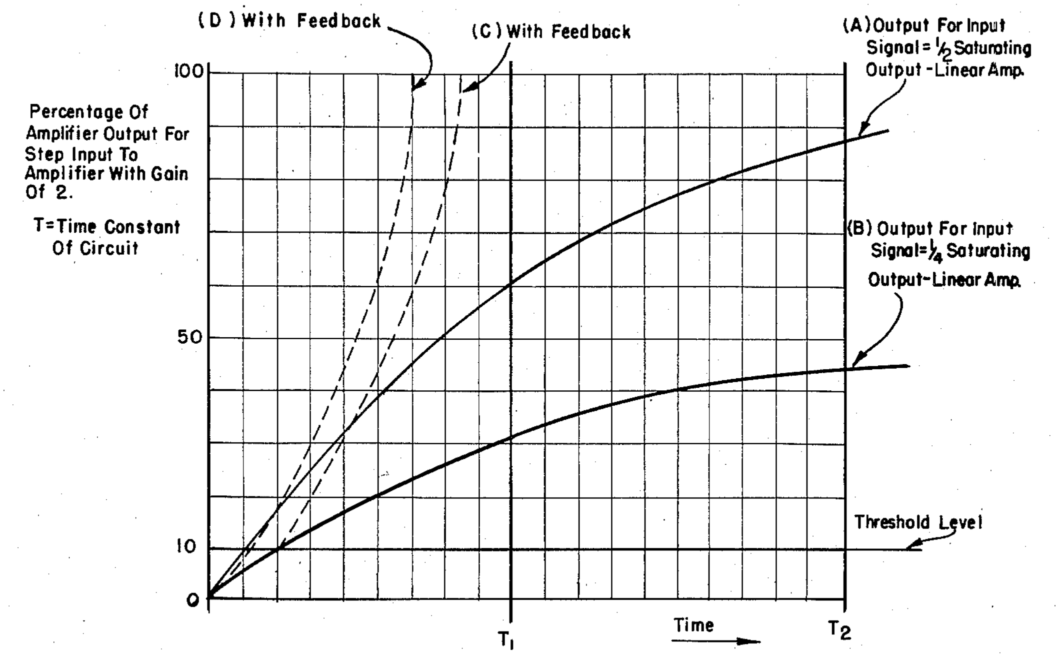
Figure 6 is a curve which shows the rise times of output signals obtained from amplifiers of the present invention.

In Figure 6 is shown a chart depicting typical leading edge waveforms obtained at the output of amplifiers receiving step input signals. The time constant of the circuit, as determined by, for example, the distributed capacities and the signal source impedance, result in response to step input signals which for a typical linear amplifier will rise to about 90% of a corresponding output signal in two time constant periods. Curve A shows the resulting output of a linear amplifier for a step input of an amplitude which will operate the amplifier to saturation. For the curves shown, an amplifier gain of 2 is assumed. Thus the input signal is half the amplitude of the output signal.

Curve D shows the output signal rise of a circuit according to this invention using the same amplifier element. A threshold of 10% is used so that input noise and feedback do not cause the circuit to trip. Input signals above this 10% value cause the amplifier to operate, and corresponding amplified output signals fed back and re-amplified not only introduce more powerful input signals, but also provide a lower source impedance to more rapidly energize the circuit impedances. Accordingly, the leading edge of the output signal follows the power curve of curve D rather than the charging curve of curve A.

Even greater effectiveness of the circuit is obtained when only small input signals are available. The curve B is the output rise of a signal from a linear amplifier of gain 2 receiving an input step ¼ the amplitude of saturating output. The signal, simplified by 2, reaches a value of .45 maximum output in two time constant periods. No greater output can be obtained. Curve C shows the output signal rise obtainable with the same input signal to the amplifier in a circuit according to this invention. When the input signal exceeds the threshold, shown here as 10%, the output signal rise follows the power curve shown.

The curves of Figure 6 demonstrate that shorter rise times are obtained using the circuit of the present invention. In addition, when input signals are below the saturating value, greater power gain is obtained. The ratio of power gain/rise time thus is improved. The improvement factor is defined as:

$$I=\left[\frac{\left(\dfrac{\text{Power gain of circuit of this invention}}{\text{Rise time of circuit of this invention}}\right)}{\left(\dfrac{\text{Power gain of linear amplifier}}{\text{Rise time of linear amplifier}}\right)}\right]$$

and this improvement factor will be:

(1)

$$I=\left[\frac{2(1-R)^2}{\alpha 2\left\{\log_e(\alpha)+\dfrac{\log_e(K-1)}{(K-2)}+\dfrac{\log_e\left(1-\dfrac{KR}{K-1}\right)}{(K-1)}-\dfrac{K\log_e\left(\alpha-\dfrac{KR}{K-1}\right)}{(K-1)}\right\}}\right]$$

which for amplifier elements having large gains, say 10 or better and using the optimum value of $\alpha$, (2)

$$I=0.8\left(\frac{1}{R}-1\right)^2$$

Figure 7:
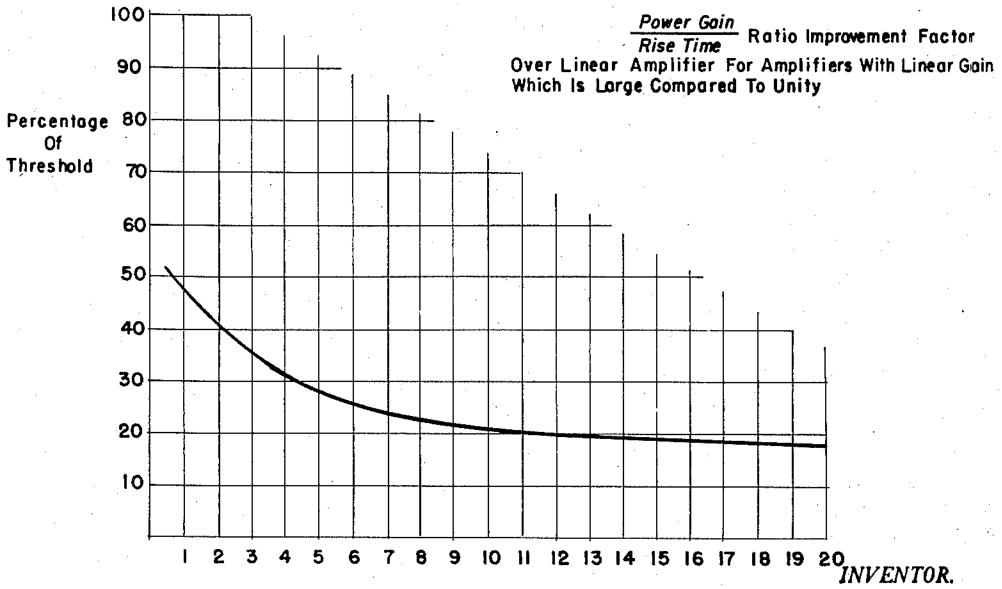
Figure 7 is a curve which shows the improvement in performance of the novel amplifiers over the prior art.

In the foregoing equations, R is defined as the threshold expressed as a ratio of the smallest signal which will pass the threshold compared to the signal input corresponding to amplifier saturation; K is the gain or amplification factor of the amplifying element; and $\alpha$ is the amplitude of the input signal expressed as a percent of the input for amplifier saturation. For large amplification factors, as expressed in Equation 2, the improvement is primarily dependent on the threshold R. Thus as the threshold is reduced, the improvement increases as shown in Figure 7. It should be noted, however, that in a practical circuit, there is a limit to how small the threshold can be made since circuit noise exceeding the threshold may trip the circuit in the absence of an input signal.

I claim to have invented:

1. An amplifier for a computing system where spaced pulses are to be amplified comprising amplifying means having an input and an output, first and second feedback paths connecting the output to the input, and control means controlling the flow of feedback currents in said paths to periodically allow feedback current to flow in each of said paths, each of said feedback paths including means determining the magnitude of feedback therein whereby the feedback in the first path is of smaller amplitude than that in the second path, said control means including means operative to allow feedback current to flow in said first path for a longer duration of time than in said second path with the flow of current in the second path occurring briefly during an early part of each period of flow in the first path.

2. An amplifier for a computing system where spaced pulses are to be amplified comprising amplifying means having an input and an output, first and second regenerative feedback paths connecting the output to the input, and control means controlling flow of feedback currents in said paths to periodically allow feedback currents of different magnitudes and durations to flow in said paths respectively, said last-named means including means operative to allow feedback in the first path of smaller amplitude and longer duration than that in the second path with the flow of current in the second path occurring briefly beginning concurrently with each period of flow in the first path.

3. An amplifier for a computing system where spaced pulses are to be amplified comprising amplifying means having an input and an output, a load, a gate connecting said output to said load, first and second feedback paths connecting the output to the input, and means controlling the flow of feedback currents in said paths to periodically allow feedback current to flow in said paths with the feedback in the first path being of smaller amplitude and longer duration than that in the second path and the flow of current in the second path occurring briefly during an early part of each period of flow in the first path, said last-named means closing said gate during the period of flow in said second path.

4. An amplifier for a computing system where spaced pulses are to be amplified comprising amplifying means having an input and an output, a first feedback path connecting said output to said input, a second feedback path connecting said output to said input, and means controlling flow of current in said paths to periodically allow such flow for a predetermined period in the first path and to periodically allow such flow in the second path for a period shorter than the duration of the period of flow in the first path and during an early part of each first-named period, a load, and means controlled by said last-named means for disconnecting said load from said output when current is flowing in the second path and for connecting said load to said output at other times.

5. An amplifier for a computing system where spaced pulses are to be amplified comprising amplifying means having an input and an output, first and second feedback paths connecting the output to the input, said first and second feedback paths including means whereby the amount of feedback current passed by the second path is relatively large as compared to that passed by the first path, and timing means controlling the flow of feedback currents in said paths to periodically allow feedback current to flow for different time durations in said paths, said timing means including means operative to allow feedback in the first path for a longer duration of time than that in the second path with the flow of current in the second path occurring briefly during an early part of each period of flow in the first path.

6. An amplifying system comprising an amplifier having an input and an output, first and second feedback paths connecting said output to said input, said first and second feedback paths including means whereby the amount of feedback current passed by the second path is relatively large as compared to that passed by the first path, a load, a gate connecting said output to said load, and means controlling the duration of current flow in said paths and through said gate which periodically allows flow through the second path and allows flow through the first path for a brief interval during an early part of each period of flow in the second path and which blocks flow through the gate during each said brief interval.

7. An amplifying system as defined in claim 6 and further comprising an input gate adapted to receive signals from a signal source and feed them to said input, said last-named means opening said input gate when it closes the output gate and closing said input gate when it opens the output gate.

8. An amplifying system as defined in claim 7 in which the last-named means controls the periods of flow to start said brief interval concurrently with the start of current flow in the first path.

9. An amplifying system as defined in claim 6 in which the last-named means controls the periods of flow to start said brief interval concurrently with the start of current flow in the first path.

10. In an amplifying system, an amplifier having an input and an output, means including a first gate for feeding regenerative signals from said output to said input, means including a second gate for feeding regenerative signals from said output to said input but of lesser magnitude than the signals fed by the first-named means when the first-named gate is open, and pulse generating means for controlling the opening and closing of said gates to periodically open them simultaneously and to then close the first-named gate in a relatively short period as compared to the period before closure of the second-named gate.

11. An amplifying system comprising an amplifier having an input and an output, means including a first gate for feeding signals from said output to said input, means including a second gate for feeding signals from said output to said input but of lesser magnitude than the signals fed by the first-named means when the first-named gate is open, an input gate for feeding input signals to the input of said amplifier, and pulse generating means for controlling the opening and closing of said gates to periodically open them simultaneously and to then close the first and third named gates in a relatively short period as compared to the period before closure of the second-named gate.

12. An amplifying system as defined in claim 11 and further comprising a load, an output gate connecting the output of said amplifier to said load, said output gate being controlled by the pulse generating means to disconnect the output from the load when said first and third named gates are closed and to connect the output to the load at all other times.

13. In an amplifying system, an amplifier having an input and an output, means including a first gate for feeding signals from said output to said input, means including a second gate for feeding signals from said output to said input but of lesser magnitude than the signals fed by the first-named means when the first-named gate is open, a load, a third gate connecting said output to said load, and pulse generating means for controlling the opening and closing of said gates to periodically open the first and second while closing the third one all simultaneously and to then close the first one while simultaneously opening the third one and at a still later time close the second one.

14. An amplifying system comprising an amplifier having an input and an output, means including a first gate for feeding signals from said output to said input, means including a second gate for feeding signals from said output to said input but in lesser magnitude than the signals fed by the first-named means, a third gate for feeding said input with input signals to be amplified, a fourth gate connected to said output for feeding the output signals to a load, and pulse generating means for controlling said gates periodically and during each of a series of spaced periods operating the gates in the following sequence, first opening the first three gates while closing the fourth, secondly closing the first and third gates while opening the fourth and thirdly closing the second gate.

15. The amplifying system of claim 14, wherein said amplifier comprises an electron discharge device having an anode, a cathode and a grid, the cathode-grid circuit of said device comprising said input, and the cathode-anode circuit of said device comprising said output.

16. The amplifying system of claim 14, wherein said amplifier comprises a transistor.

17. In an amplifying system, an amplifier having an input and an output, a transformer having a primary energized by said output and three secondaries, a load fed by one of said secondaries, a first feedback path fed by the second secondary and feeding energy back to said input, a second feedback path fed by the third secondary and feeding energy back to said input, the second secondary being larger than the third to thus produce more feedback in the first than in the second feedback path, first and second gates respectively in said two feedback paths, and pulse generating means controlling said gates to periodically open them substantially simultaneously while closing the first gate after a relatively short period as compared to the period before closure of the second gate.

References Cited in the file of this patent

UNITED STATES PATENTS 2,636,080 Doba ---------------- Apr. 21, 1953